United States Patent [19]

Kaneko

[11] Patent Number: 5,740,113
[45] Date of Patent: Apr. 14, 1998

[54] SEMICONDUCTOR MEMORY DEVICE

[75] Inventor: Tetsuya Kaneko, Kanagawa, Japan

[73] Assignee: Kabushiki Kaisha Toshiba, Kawasaki, Japan

[21] Appl. No.: 571,135

[22] Filed: Dec. 12, 1995

[30] Foreign Application Priority Data

Dec. 19, 1994 [JP] Japan ................. 6-312991

[51] Int. Cl.$^6$ .................................................. G11C 7/00
[52] U.S. Cl. ..................... 365/189.11; 365/149; 365/203
[58] Field of Search ................................. 365/149, 203, 365/189.11, 189.09, 226

[56] References Cited

U.S. PATENT DOCUMENTS

| | | | |
|---|---|---|---|
| 4,947,377 | 8/1990 | Hannai | 365/149 X |
| 5,237,534 | 8/1993 | Tanaka et al. | 365/203 X |
| 5,291,437 | 3/1994 | Rountree | 365/149 |
| 5,402,378 | 3/1995 | Min et al. | 365/203 X |

*Primary Examiner*—Joseph A. Popek
*Attorney, Agent, or Firm*—Foley & Lardner

[57] ABSTRACT

A semiconductor device constituted by a booster circuit, memory cell arrays, a sense amplifier circuit, transmission gate circuits, equalizing circuits and a control circuit applying a boosted potential respectively to the gates of MOS transistors of the transmission gate circuits and the equalizing circuits when no memory cells of the memory cell arrays are selected whereby the capacitance of de-coupling capacitors connected to output terminals of the booster circuit can be reduced thereby contributing to reduction in chip area.

49 Claims, 12 Drawing Sheets

Fig. 1
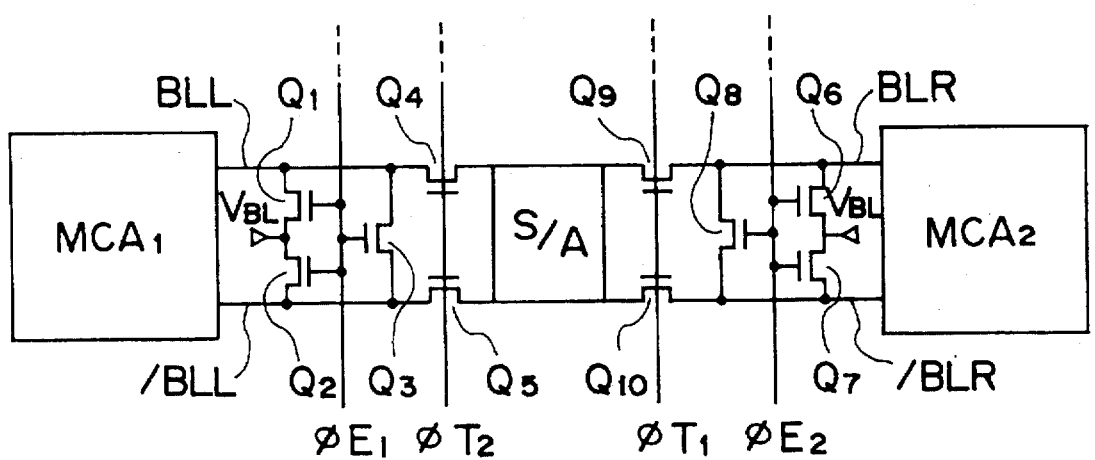
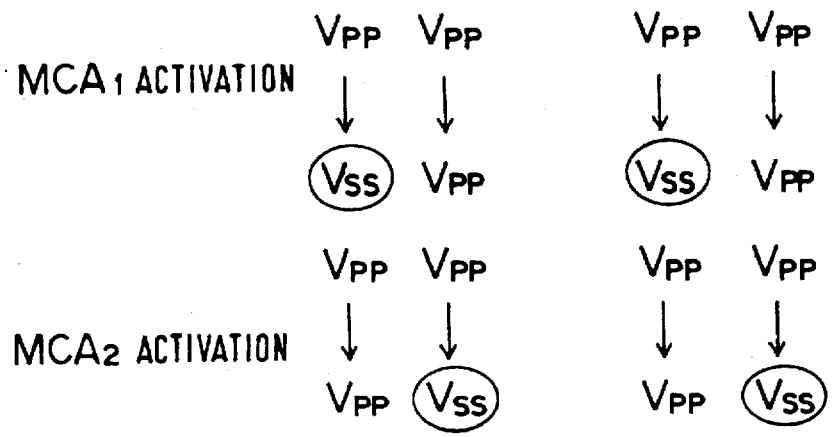

Output characteristic of internal voltage generator (normal 85°C)

SEMICONDUCTOR MEMORY DEVICE

FIELD OF THE INVENTION

The present invention relates to a semiconductor memory, more particularly, to a DRAM (dynamic type random access memory) of a shared sense amplifier structure, which includes a booster circuit for generating a stationary boosted potential as a word line driving potential.

BACKGROUND OF THE INVENTION

The conventional DRAM has utilized boot-strap-type word line driving circuits, which use N channel MOS transistors as word line drivers in word line driving circuits. This technology is disclosed in IEEE ISSCC DIGEST OF TECHNICAL PAPERS PP12–13 Feb. 16, 1977. Meanwhile, reduction of power supply voltage and advancement of micro lithography technology have realized an arrangement of P channel type MOS transistors as word line drivers on every word line. Therefore a newly developed 64M bit DRAM has word line driving circuits each of which has a P channel MOS transistor, and a booster circuit to generate a word line driving voltage, which cause no threshold voltage drop of the word line driving voltage across the P channel MOS transistor.

However, if a booster circuit is formed in a chip, a capacitor which is connected to the output of the booster circuit occupies a very large area in order to stabilize the output potential. Accordingly, a conventional DRAM with built-in booster circuit has a problem of chip area increase.

SUMMARY OF THE INVENTION

It is an object of the present invention to minimize a capacitor area for potential stabilizing capacitors which are connected to an output of a word line driving potential booster circuit.

To achieve the above object, the present invention provides a semiconductor memory device comprising: a booster circuit generating a boosted potential; a first memory cell array including first pairs of bit lines; a second memory cell array including second pairs of bit lines; a sense amplifier circuit; a first transmission gate circuit having pairs of transistors for connecting the first pairs of bit lines to the sense amplifier circuit; a second transmission gate circuit having pairs of transistors for connecting the second pairs of bit lines to the sense amplifier circuit; a first equalizing circuit having transistors equalizing the first pairs of bit lines; a second equalizing circuit having transistors equalizing the second pairs of bit lines; and a control circuit applying the boosted voltage respectively to gates of the transistors in the first and the second transmission gate circuits and gates of the transistors in the first and the second equalizing circuits when none of memory cells in the first and the second memory cell arrays is selected.

In another aspect of the present invention, a semiconductor memory device is provided comprising: a booster circuit for generating a boosted potential; a first memory cell array including first pairs of bit lines; a second memory cell array including second pairs of bit lines; a sense amplifier circuit; a first transmission gate circuit having pairs of transistors connecting the first pairs of bit lines to the sense amplifier circuit; a second transmission gate circuit having pairs of transistors connecting the second pairs of bit lines to the sense amplifier circuit; and a control circuit applying the boosted potential respectively to the gates of the transistors in the first and the second transmission gate circuits when none of the memory cells in the first and the second memory cell arrays is selected.

By using the means provided by the present invention the boosted potential is applied on the gates of the transistors in the first and the second transmission gate circuits and on the first and the second equalizing circuits when none of the memory cells of the first and the second memory cell arrays is selected. That is, at this moment these transistors work as capacitive elements to be connected to the output of the booster circuit. Accordingly, the capacitance to be connected to the output of the booster circuit can be reduced by an amount corresponding to the parasitic capacitance of these transistors. Further, even when the memory cells in either of the first and the second memory cell arrays are selected, half of the transistors in the transmission gate circuits and the equalizing circuits are connected to the output of the booster circuit, the half work as capacitive elements and the capacitance to be connected to the booster circuit can be reduced by an amount corresponding to their parasitic capacitance.

As stated above the transistors of the transmission gates and the like which have conventionally been connected to the ground potential in a nonselection time, are used as the capacitor for the booster circuit by which the area of the capacitive elements can be reduced by an amount corresponding to the parasitic capacitance.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

A more complete appreciation of the present invention and many of its attendant advantages will be readily obtained by reference to the following detailed description considered in connection with the accompanying drawings, in which:

FIG. 1 is a circuit diagram of the semiconductor memory of the present invention showing essential parts, and an operation diagram thereof;

DETAILED DESCRIPTION OF PREFERRED EMBODIMENTS

Figure 2:
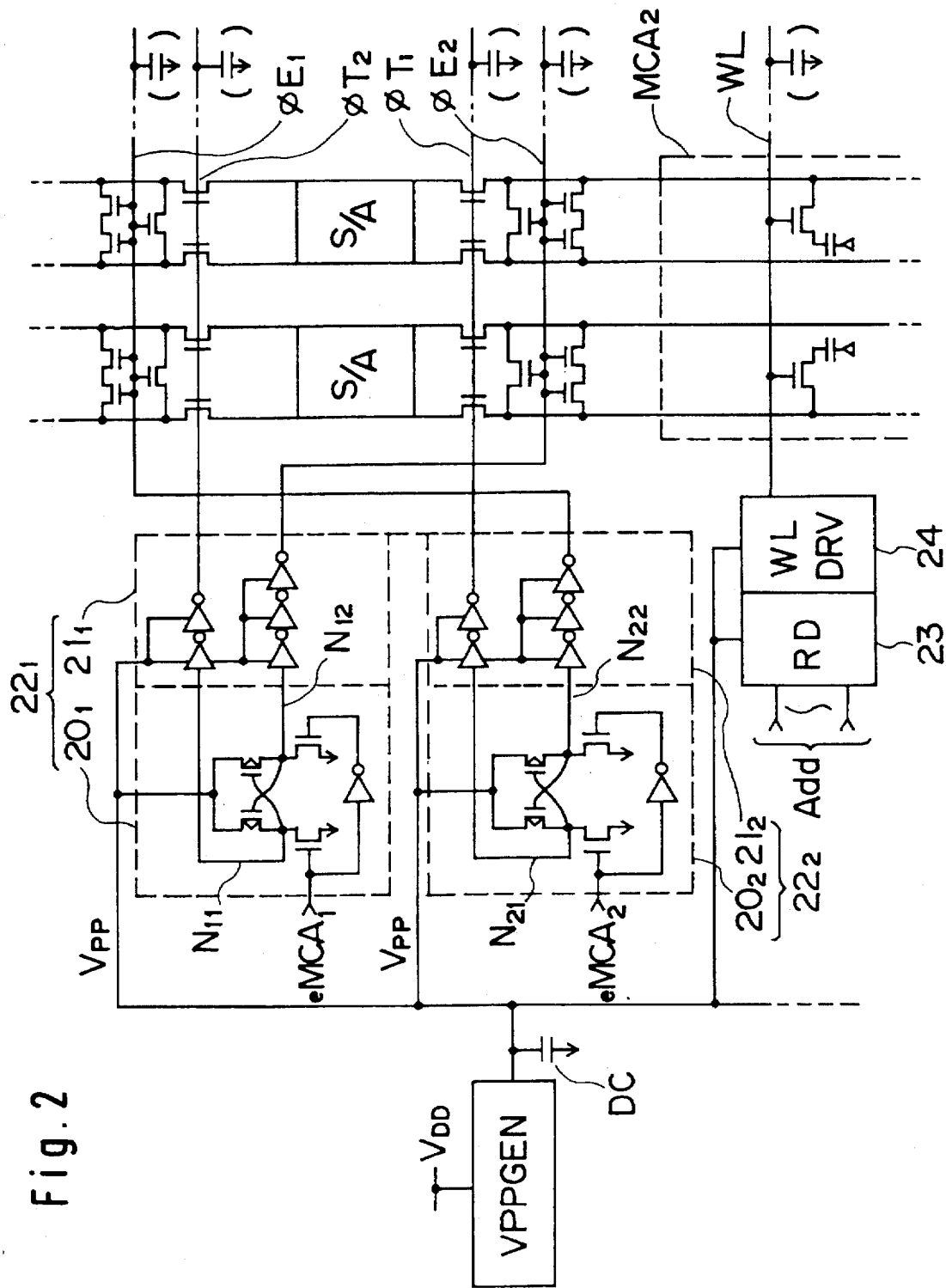
FIG. 2 is a circuit diagram of the semiconductor memory, showing more details of the essential part in FIG. 1 and the control circuit thereof.

Embodiments of the present invention will be described in detail with reference to the drawings.

Although the present invention is naturally applicable to various semiconductor memory devices (SRAM, EPROM, MROM etc.) the explanation will be given of a DRAM since the present invention is preferable to a DRAM.

FIG. 1 shows essential parts of the present invention which are constituted by a first memory cell array MCA1, a second memory cell array MCA2, a pair of left bit lines BLL and/BLL, a pair of right bit lines BLR and/BLR, a sense amplifier S/A and the like. Further, the embodiment includes a left bit line pair equalizing circuit constituted by N-channel MOS transistors Q1, Q2 and Q3, a left transmission gate constituted by N-channel MOS transistors Q4 and Q5, a right bit line pair equalizing circuit constituted by N-channel MOS transistors Q6, Q7 and Q8 and a right transmission gate circuit constituted by N-channel MOS transistors Q9 and Q10. A plurality of dynamic type memory cells are arranged in a matrix in each of the memory cell arrays MCA1 and MCA2. The memory cells belonging to the same column are connected by the same pair of bit lines and the memory cells belonging to the same row are connected by the same word line. The left bit line pair equalizing circuit is controlled by a signal $\phi E1$. When $\phi E1$ is at a boosted potential Vpp (for example, 4.3V in comparison with ground potential), VBL (for example, 1.5V which is about a half of potential of VDD that is an inner power source potential) is supplied to the left bit line pair BLL and/BLL and both are shortcircuited. When $\phi E1$ is at a ground potential Vss (0V) all the MOS transistors in the circuit are made nonconductive. The right bit line pair equalizing circuit is controlled by a signal $\phi E2$. When $\phi E2$ is at the boosted potential Vpp, VBL is supplied to the right bit line pair BLR and/BLR and both are shortcircuited. When $\phi E2$ is at the ground potential Vss, all the MOS transistors in the circuit are made nonconductive. The left transmission gate circuit is controlled by a signal $\phi T2$. When $\phi T2$ is at the boosted potential Vpp, the left bit line pair BLL and/BLL is connected to the sense amplifier S/A. When $\phi T2$ is at the ground potential Vss, the left bit line pair BLL and/BLL and the sense amplifier S/A are disconnected from each other. The right transmission gate circuit is controlled by a signal $\phi T1$. When $\phi T1$ is at the boosted potential Vpp, the right bit line pair BLR and/BLR are connected to the sense amplifier S/A. When $\phi T1$ is at the ground potential Vss, the right bit line pair BLR and/BLR and the sense amplifier S/A are disconnected from each other.

In the above-constituted DRAM, when none of the memory cells in the first and the second memory cell arrays is selected, all of $\phi E1$, $\phi E2$, $\phi T1$, $\phi T2$ are connected to Vpp. Since a word line, not shown, is in a nonselect state, data stored in the memory cells are not destroyed. At this moment, all the MOS transistors Q1 through Q10 in FIG. 1 are connected to Vpp and accordingly, the transistors provide a parasitic capacitance connected in parallel to capacitive elements that are to be connected to output terminals of a booster circuit, not shown, by which the capacitive elements can be made smaller by the amount of the parasitic capacitance.

When the memory cells in the first memory cell array are selected, as shown in FIG. 1, $\phi E1$ is changed from Vpp to Vss, $\phi T2$ is maintained as Vpp, $\phi T1$ is changed from Vpp to Vss and $\phi E2$ is maintained at Vpp by which the sense amplifier S/A and the second memory cell array MCA2 are disconnected from each other and the equalizing operation of the left equalizing circuit is released.

When the memory cells in the second memory cell array are selected, in a similar way, $\phi E1$ is maintained as Vpp, $\phi T2$ is changed from Vpp to Vss, $\phi T1$ is maintained at Vpp and $\phi T2$ is changed from Vpp to Vss by which the sense amplifier S/A and the first memory cell array MCA1 are disconnected from each other and the equalizing operation of the right equalizing circuit is released.

As stated above, by using the transistors of the transmission gates and the like which have conventionally been connected to the ground potential in a nonselect time as a capacitor of the booster circuit, the area of the capacitive elements can be reduced by the amount of their parasitic capacitance.

Next, FIG. 2 shows essential parts of the present invention and the details of a control system. The control system is constituted by a booster circuit VPPGEN generating the boosted potential Vpp from an inner power source potential VDD, a capacitor DC (hereinafter, decoupling capacitor), a circuit $21_1$ for selecting and driving MCA1 which includes a first level shift circuit $20_1$ and a first drive circuit $21_1$, a circuit $22_2$ for selecting and driving MCA2 which includes a second level shift circuit $20_2$ and a second drive circuit $21_2$, a row decode circuit 23, a word line driving circuit 24 and the like.

The level shift circuits $20_1$ and $20_2$ respectively use Vpp as a power source and shift eMCA$_1$ and eMCA$_2$ which are output signals of a memory cell array select circuit, not shown, from a logic level (amplitude between Vss–VDD) to a boost level (amplitude between Vss–Vpp). The drive circuits $21_1$ and $22_2$ respectively use Vpp as the power source and respectively drive $\phi E1$, $\phi E2$, $\phi T1$ and $\phi T2$ by amplifying input signals at the booster level as output signals at the same booster level.

Figure 12:
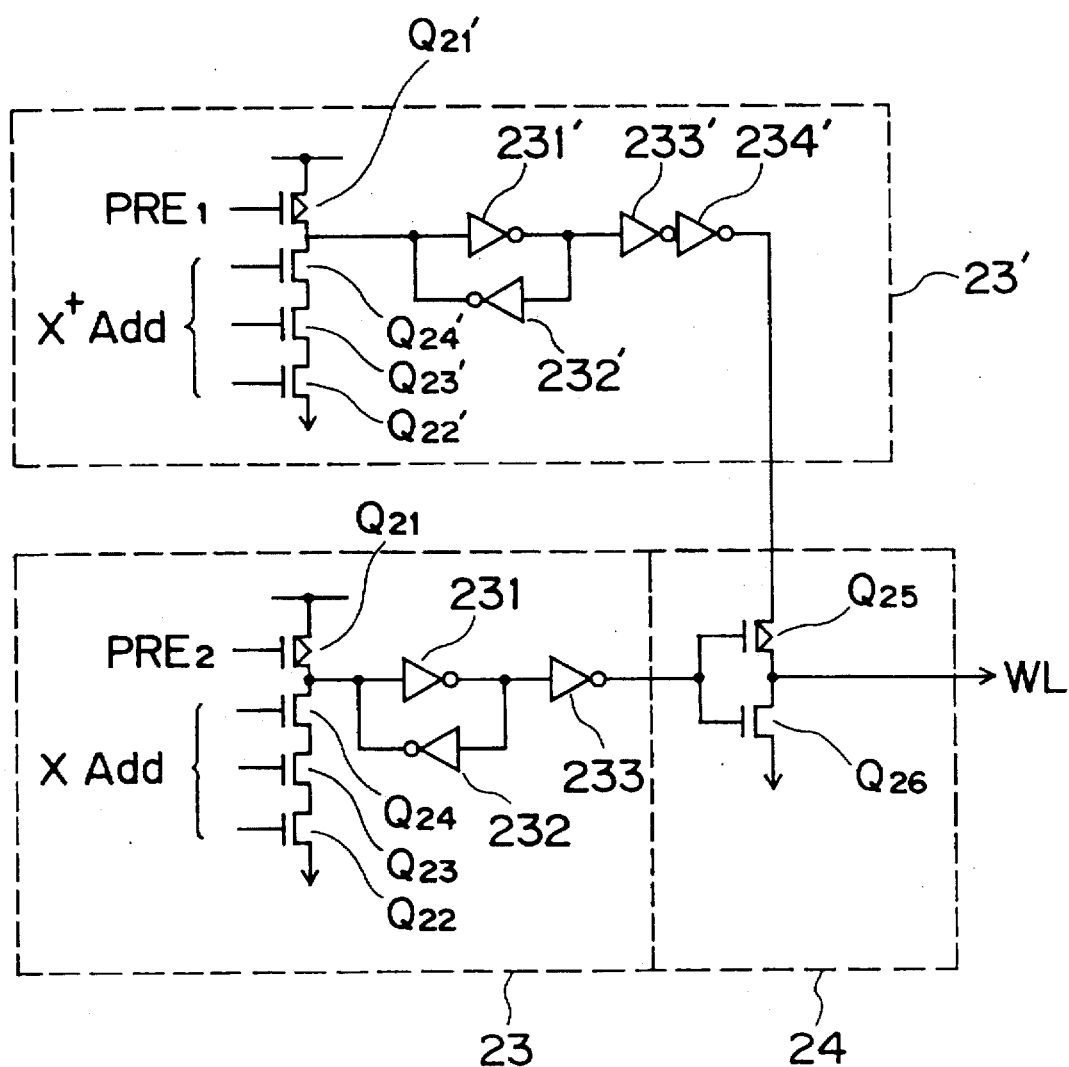
FIG. 12 is a circuit diagram showing in details a word line driving circuit and a row decode circuit.

The row decode circuit 23, the predecode circuit 23' (refer to FIG. 12) and the word line driving circuit 24 use Vpp as the power source and select and drive word lines to the booster level. FIG. 12 shows the details thereof. The row decode circuit 23 is constituted by a circuit where a P-channel MOS transistor Q21 on the gate of which a signal PRE 2 at the booster level is applied is connected in series to N-channel transistors Q22, Q23 and Q24 on the gates of which a row address signal X Add at the logic level is applied and three inverter circuits 231, 232 and 233. The predecode circuit 23' is constituted by a circuit where a P-channel MOS transistor Q21' on the gate of which a signal PRE 1 at the booster level is applied is connected in series to N-channel MOS transistors Q22', Q23' and Q24' on the gates of which a row address signal X+Add at the logic level is applied and four inverter circuits 231', 232', 233' and 234'. The word line driving circuit 24 is constituted by inverter circuits Q25 and Q26 which use Vpp as the power source.

Next, an explanation will be given of the operation of the circuit shown in FIG. 2. When both of MCA1 and MCA2 are not selected, the signal eMCA$_1$ and the signal eMCA$_2$ are both at LOW level (Vss). At this moment the potentials of $N_{11}$, $N_{12}$, $N_{21}$ and $N_{22}$ are respectively at Vpp, Vss, Vpp and Vss. The signals are amplified by the amplifying circuits $20_1$ and $20_2$ and all of $\phi E1$, $\phi E2$, $\phi T1$ and $\phi T2$ are at Vpp. Here, the output terminal of the booster circuit and the respective signal lines of φE1, φE2, φT1 and φT2 are commonly connected via P-channel MOS transistors on pull-up side at the final stage of inverters (constituted by P-channel MOS transistor and N-channel MOS transistor) in the drive circuits $21_1$ and $21_2$. Further, these respective signal lines simultaneously drive a great number of bit line pairs (several hundreds) in the memory cell arrays and accordingly, the parasitic capacitance is very large. As a result, it is possible to make comparatively small the capacitance of the de-coupling capacitor DC.

Next, the operation in case where $MCA_2$ is selected is shown as an example. The signal eMCA1 is changed from low level to high level (VDD) and the signal $eMCA_2$ is maintained at low level. As a result, the potentials of $N_{11}$, $N_{12}$, $N_{21}$ and $N_{22}$ are respectively at Vss, Vpp, Vpp and Vss. The signals are amplified at the drive circuits $21_1$ and $21_2$ and φE1, φE2, φT1 and φT2 respectively become Vpp, Vss, Vpp and Vss. As a result the sense amplifier S/A and the first memory cell array MCA1 are disconnected from each other and the equalizing operation of the right equalizing circuit is released. Successively, the word line WL is driven to the booster level by the operation of the word line driving circuit 24 and the operation such as reading is performed by the operation of the sense amplifier S/A.

A similar operation is performed when MCA1 is selected and accordingly, the explanation will be omitted.

Figure 3:
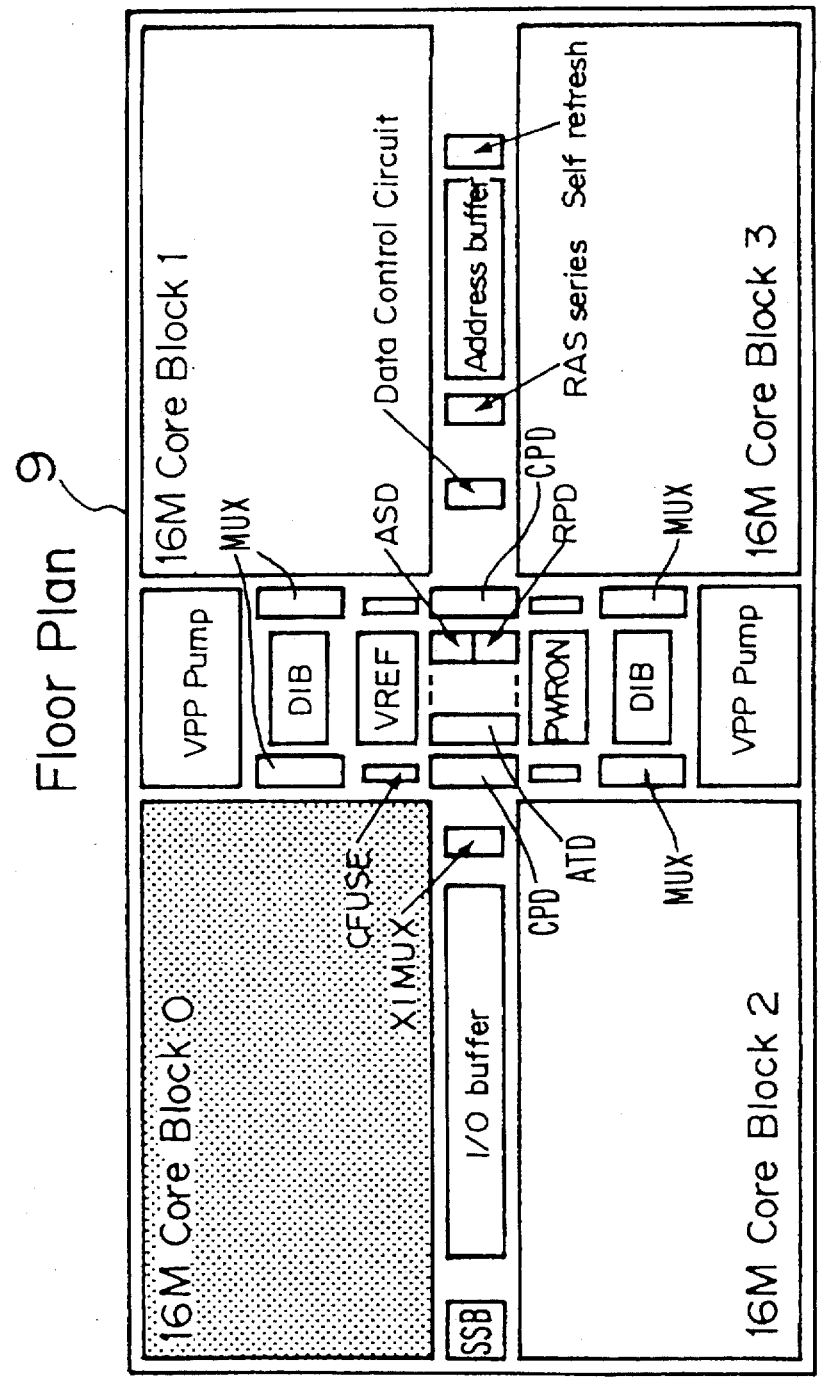
FIG. 3 is an entire circuit configuration diagram of the embodiment of the present invention.

FIG. 3 shows an outline structural view of a DRAM of the present invention. The total memory capacity is assumed to be that of a 64M bit DRAM. Core blocks CB0, CB1, CB2 and CB3 each constituted by 16M bit memory cells and peripheral circuits within a core section such as sense amplifiers, decoders and the like accompanying the memory cells, are arranged in a semiconductor chip 9. Vpp generating circuits Vpp Pump, each generating the boosted voltage Vpp of a word line, are respectively arranged between CB0 and CB1, and CB2 and CB3. Data multiplexer circuits MUX and data buffer circuits DIB are respectively arranged at data output units of the respective core blocks CB. Fuse arrays CFUSE for holding replaced data of column redundancy circuits are arranged at the vicinities of the respective core blocks. A reference voltage generating circuit VREF for generating a reference potential that is at an intermediate potential of ½ Vcc etc. is arranged between CB0 and CB1. A power-on reset circuit PWRON for generating an initializing signal when the internal portion of the chip is initialized in case where power source is on, is arranged between CB2 and CB3. A substrate potential generation circuit SSB, a data input/output buffer I/O buffer and Pad, an IO data multiplexer circuit X1MUX for selecting Pad in accordance with data output width are successively arranged between CB0 and CB2. A self refresh control circuit, Self refresh, an address buffer, Address buffer, a row series control circuit RAS series and a data control circuit DCC are successively arranged between CB1 and CB3. Further, column partial decoder circuits CPD, an address transition detection circuit ATD, a row partial decoder circuit RPD and a column address switch circuit ASD are respectively arranged at the central portion of the chip.

Figure 4:
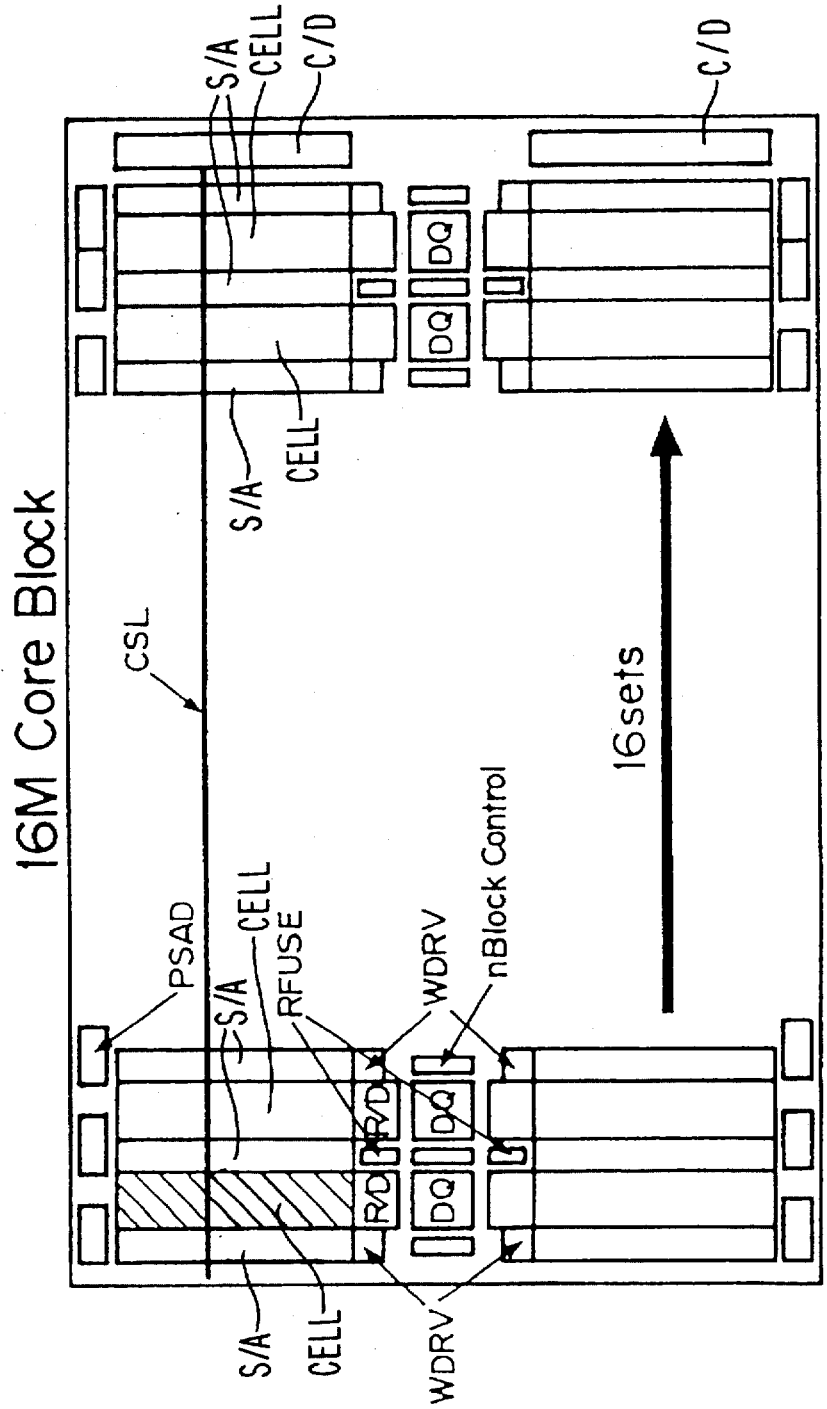
FIG. 4 is a plane view of the semiconductor memory device of the embodiments of the present invention, showing details of the essential parts of FIG. 3.

Next, FIG. 4 shows the structure of the 16M bit core block CB. 32 sets of memory cell arrays Cell and 33 sets of peripheral circuits within a core section S/A are alternately arranged constituting the memory cell block and the column decoder circuits C/D are arranged at an end thereof. A plurality of column select lines CSL are arranged in the column direction, and are selectively driven by the column decoder circuits C/D. The column select lines CSL supply selection signals to the peripheral circuits within a core section S/A at each column belonging to the same row. More in details particularly, the column select line is used for partial activation of the sense amplifier circuits and for driving the column gate circuits. The memory cell block constitutes the 16M bits core block CB by dividing it into top and bottom groups between which respectively arranged are row decoder circuits R/D(23), each corresponding to each memory cell array, circuits WDRV for supplying drive signals to the row decoder circuits, circuits RFUSE for holding replaced data of row redundancy circuits, data line amplifying circuits DQB, a block control circuit BC and the like. P-channel type sense amplifier drive circuits PSAD each corresponding to each peripheral circuit within a core section are respectively arranged at peripheral portions of the core blocks CB.

The memory cell arrays MCA1 and MCA2 shown in FIG. 1 and FIG. 2 respectively correspond to the memory cell arrays Cell in FIG. 4. As is illustrated one, 16M core block CB has 64 of the memory cell arrays Cell (MCA) and a single chip has 256 of the memory cell arrays Cell (MCA). The following description indicates how much parasitic capacitance is provided by the block structure shown in FIG. 3 and FIG. 4 and how much capacity of the de-coupling capacitor can be saved as a result.

First, the contribution of the transmission gate circuits will be calculated. There are 1024 pairs of bit lines in one memory cell array (disregarding redundancy bit lines). Therefore, the number of the transmission gate circuits in a single chip is 262144. Incidently, a single transmission gate circuit is constituted by two N-channel transistors. Therefore, the number of the MOS transistors in the transmission gate circuits is 524288. For example, assuming the gate width of 0.8 mm and the gate length of 0.56 μm in one MOS transistor, the area of the channel regions in one MOS transistor is 0.45 μm$^2$. By multiplying the area to all the MOS transistors the area amounts to 234880 μm$^2$. Assuming the gate oxide film thickness of 12 nm, it corresponds to a parasitic capacitance of 0.68 nF.

Secondly, the contribution of the equalizing circuits will be calculated. The number of the equalizing circuits in a single memory cell array is also 262144. A single equalizing circuit is constituted by three MOS transistors, that is, two MOS transistors each having the gate width of 0.8 μm and the gate length of 0.56 μm and one MOS transistor having the gate width of 2.0 μm and the gate length of 0.56 μm. Accordingly, when the area is multiplied for all the MOS transistors, the total area of the channel regions amounts to 528482 μm$^2$. This corresponds to a parasitic capacitance of 1.52 nF.

The parasitic capacitance calculated as above amounts to approximately 2.2 nF. Normally several (4 in a refresh cycle product having 8 K and 8 in a refresh cycle product having 4 K) memory cell arrays are selected in reading. Therefore, substantially all of the memory cell arrays contribute to the parasitic capacitance. Further, in a 64M DRAM, a de-coupling capacitor DC having a capacitance of approximately 5 nF is necessary to guarantee a stable operation. However, it is possible to approximately halve it to 2.8 nF by the circuit structure of the present invention which contributes to a considerable reduction in the chip area.

In this way, the memory device is divided into a number of memory cell arrays as in a DRAM having a large capacity and a ratio of the number of the memory cell arrays that are simultaneously activated to a total thereof is reduced by which the total amount of the parasitic capacitance can be increased which as a result contributes to the considerable reduction in the chip area.

Figure 11:
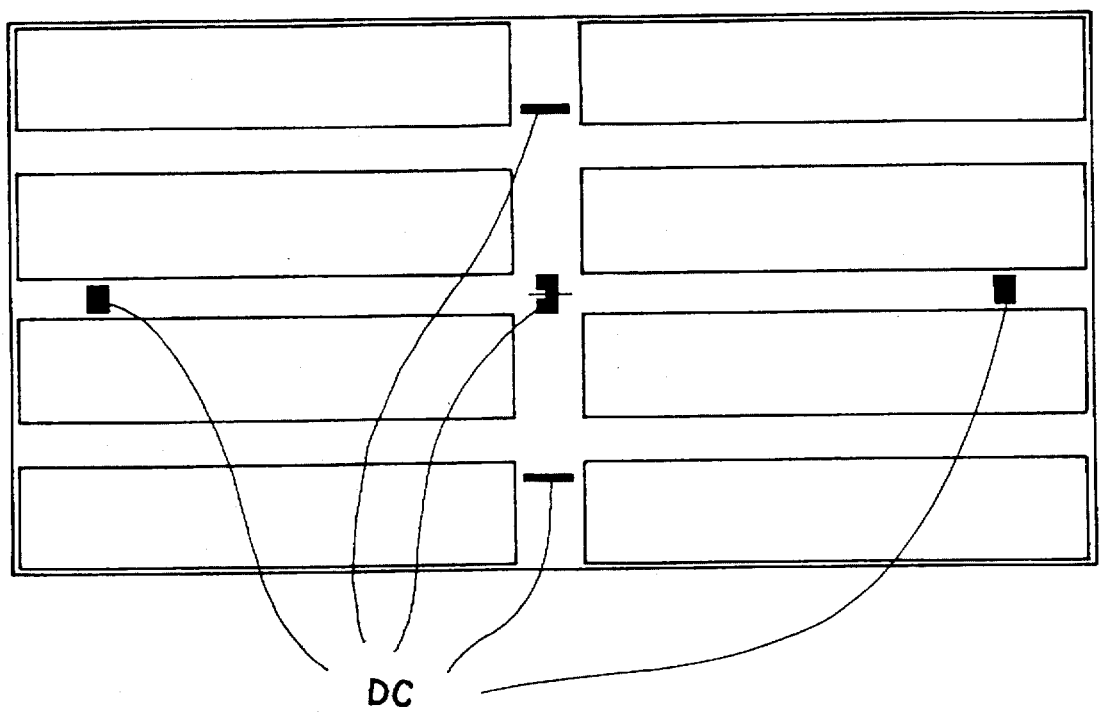
FIG. 11 is a plane view showing locations of decoupling capacitors.

Further, as shown in FIG. 11 the de-coupling capacitors DC are scattered all over the chip.

Next, a detailed explanation will be given of the booster circuit VPPGEN in reference to FIG. 5 through FIG. 10.

Figure 5:
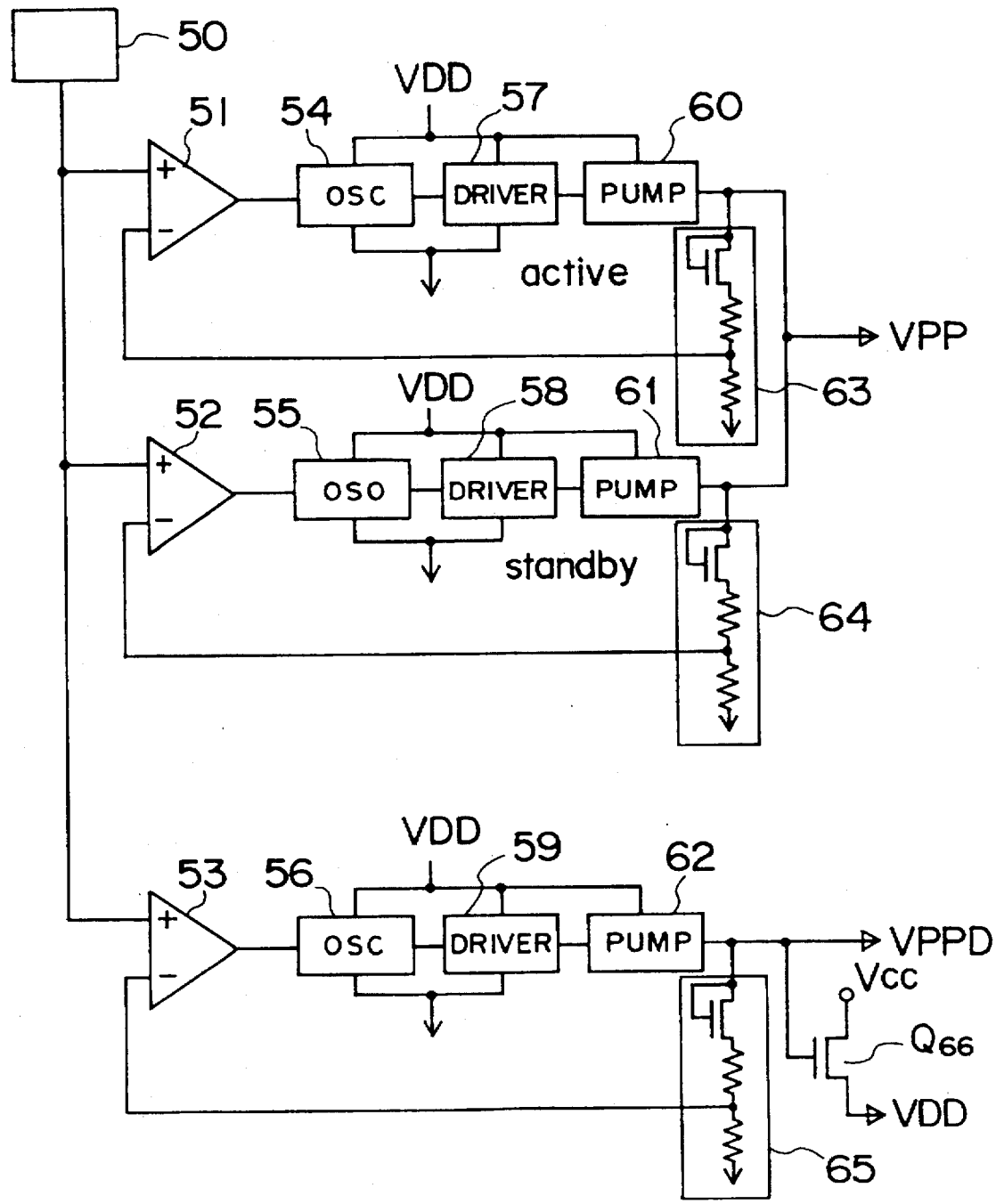
FIG. 5 is a structural diagram of a booster circuit of a semiconductor memory device of the embodiments.

FIG. 5 shows the circuit structure of the booster circuit VPPGEN. The booster circuit is constituted by a reference potential generating circuit 50, comparing circuits 51, 52 and 53, ring oscillator circuits 54, 55 and 56, driver circuits 57, 58 and 59, charge pump circuits 60, 61 and 62, voltage dividing circuits 63, 64 and 65 and a power source voltage step-down transistor Q66. As shown in FIG. 5, an outer potential Vcc inputted from the outside is stepped down by the power source voltage step-down transistor Q66 whereby VDD is generated and VDD is again boosted by the charge pump circuits 60 and 61 whereby the boosted potential Vpp is generated. The power source voltage step-down transistor Q66 is driven by VPPD that is a potential boosted from VDD. Further, the generation of Vpp is performed by two kinds of systems, that is, a system exclusive for standby and a system exclusive for operation. In this way, the booster circuit is constituted by three booster systems each performing the boosting operation independently by a feedback type control.

Figure 6:
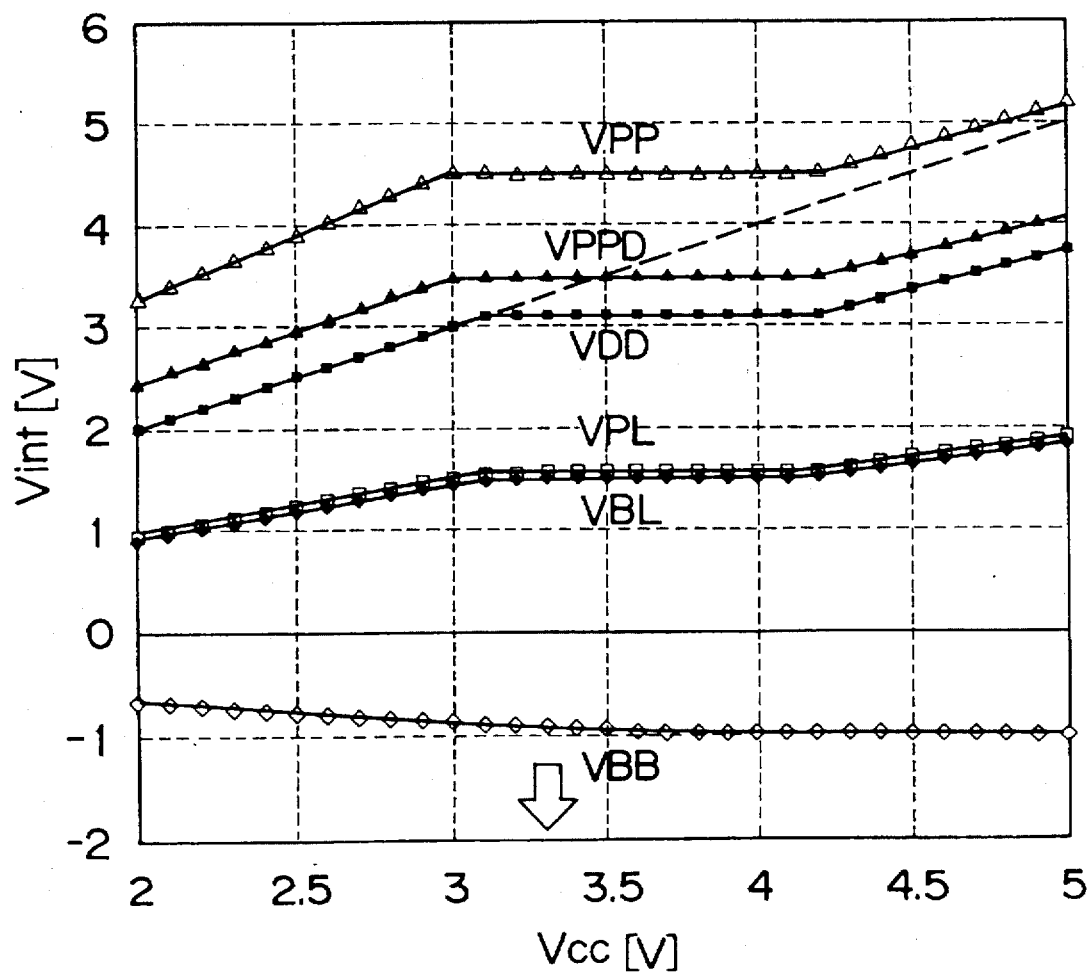
FIG. 6 is a view showing operational characteristic of the booster circuit of FIG. 5.

FIG. 6 shows behaviors of changes of Vpp, VPPD and VDD with respect to Vcc along with those of a cell capacitor plate potential VPL, a bit line potential VBL and a substrate potential VBB. There is a nonvariational region of potentials between approximately 3V to approximately 4V.

Figure 7:
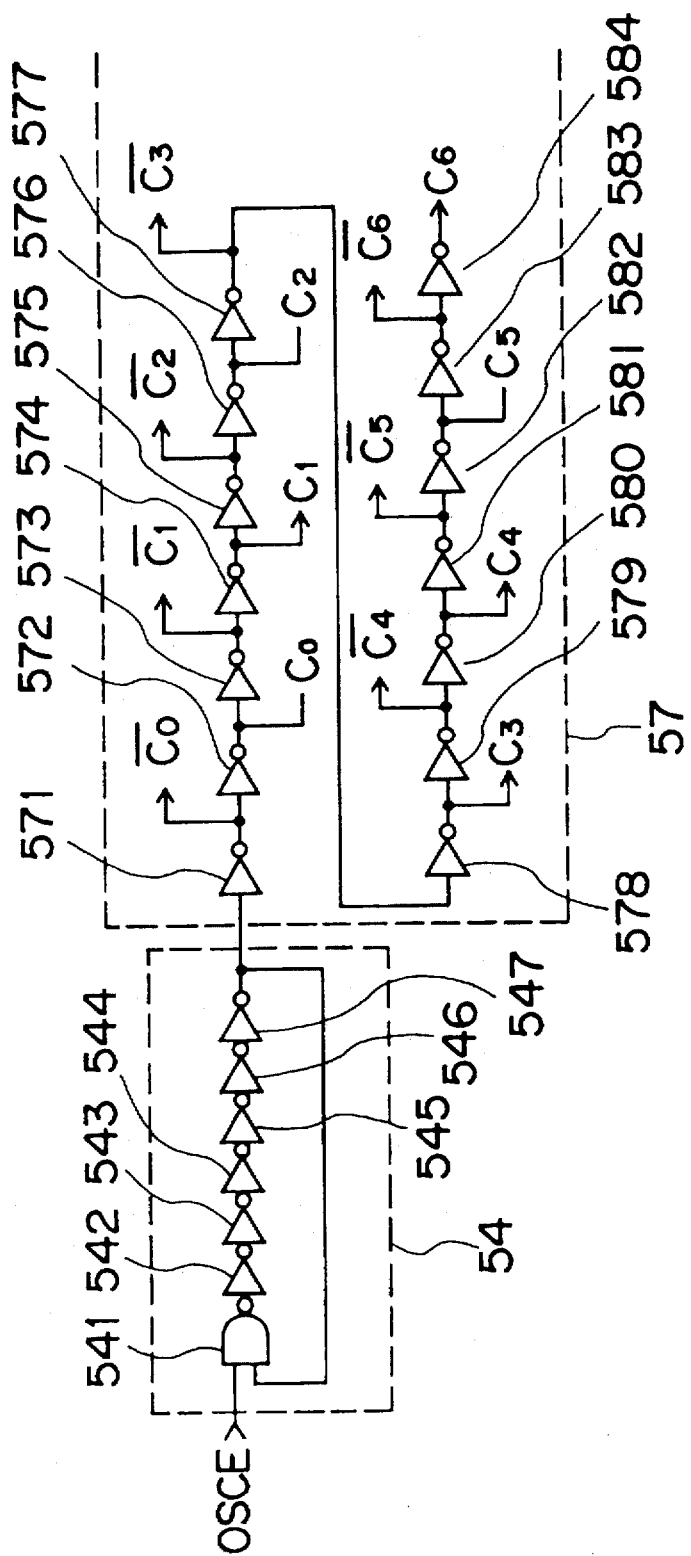
FIG. 7 is a circuit diagram showing in detail the booster circuit of FIG. 5.

FIG. 7 shows the detail of the ring oscillator 54 and a portion of the driver circuit 57. In the ring oscillator 54 a NAND gate 541 and even number stages of inverters 542, 543, 544, 545, 546 and 547 are connected in a ring-like form. In the driver circuit inverter circuits 571, 572, 573, 574, 575, 576, 578, 579, 580, 581, 582, 583 and 584 are connected in series respectively forming successively delayed signal outputs /C0, C0, /C1, C1, /C2, C2, /C3, C3, /C4, C4, /C5, C5, /C6 and C6.

Figure 8:
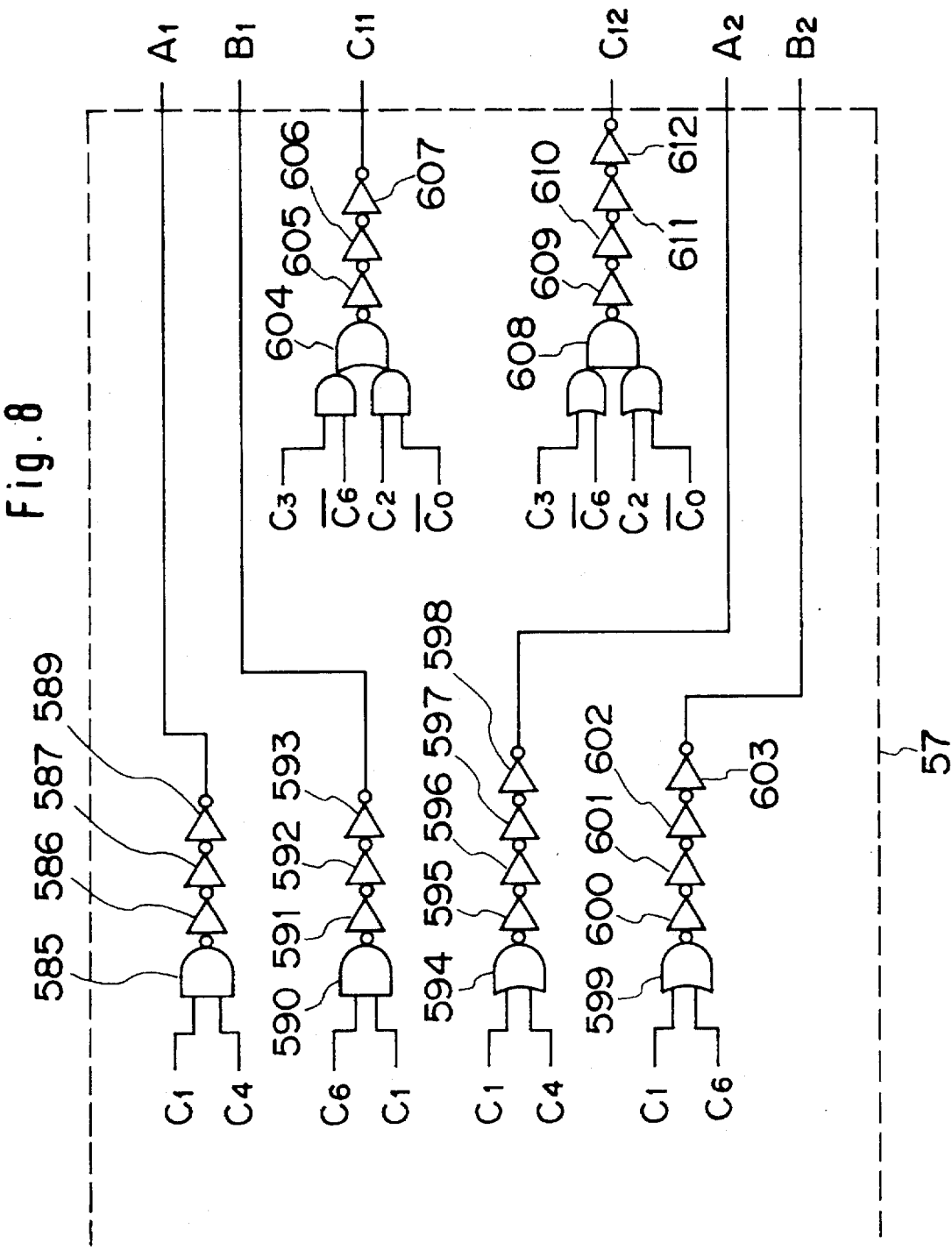
FIG. 8 is a circuit diagram showing in detail the booster circuit of FIG. 5

FIG. 8 shows the remaining portion of the driver circuit 57. A signal $A_1$ is formed from the signals $C_1$ and $C_4$ by a NAND gate 585 and inverters 586, 587 and 589. A signal $B_1$ is formed from the signals $C_1$ and $C_6$ by a NAND gate 590 and inverters 591, 592 and 593. A signal $C_{11}$ is formed from the signals $C_3$, /$C_6$, $C_2$ and /$C_0$ by a ANDNOR gate 604 and inverters 605, 606 and 607. A signal $C_{12}$ is formed from the signals $C_3$, /$C_6$, $C_2$ and/$C_0$ by an ORNAND gate 608 and inverters 609,610,611 and 612. A signal $A_2$ is formed from the signals $C_1$ and $C_4$ by a NOR gate 594 and inverters 595, 596, 597 and 598. A signal $B_2$ is formed from the signals $C_1$ and $C_6$ by a NOR gate 599 and inverters 600, 601, 602 and 603.

Figure 9:
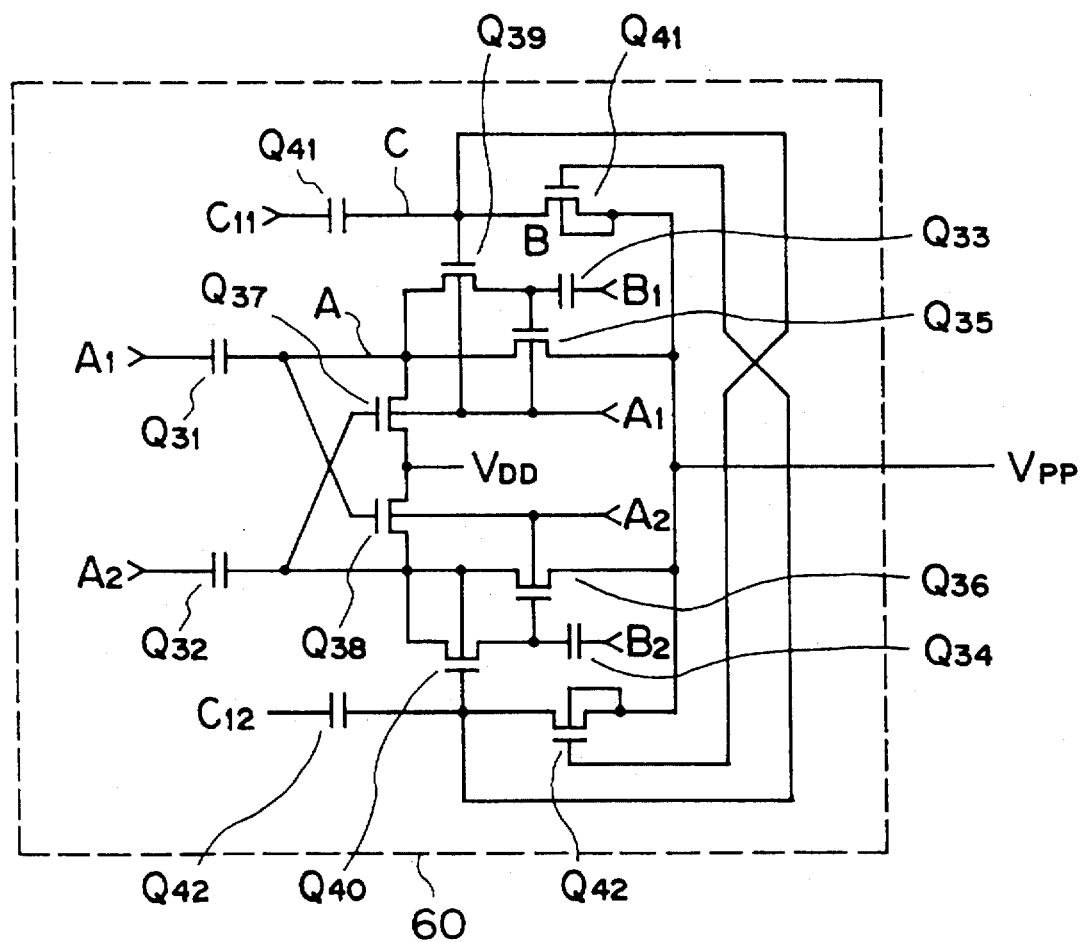
FIG. 9 is a circuit diagram showing in detail the booster circuit of FIG. 5.

FIG. 9 shows the details of the charge pump circuit. The charge pump circuit is constituted by capacitors Q31,Q32, Q33,Q34,Q41 and Q42 and N-channel MOS transistors Q35, Q36, Q37,Q38,Q39 and Q40.

Figure 10:
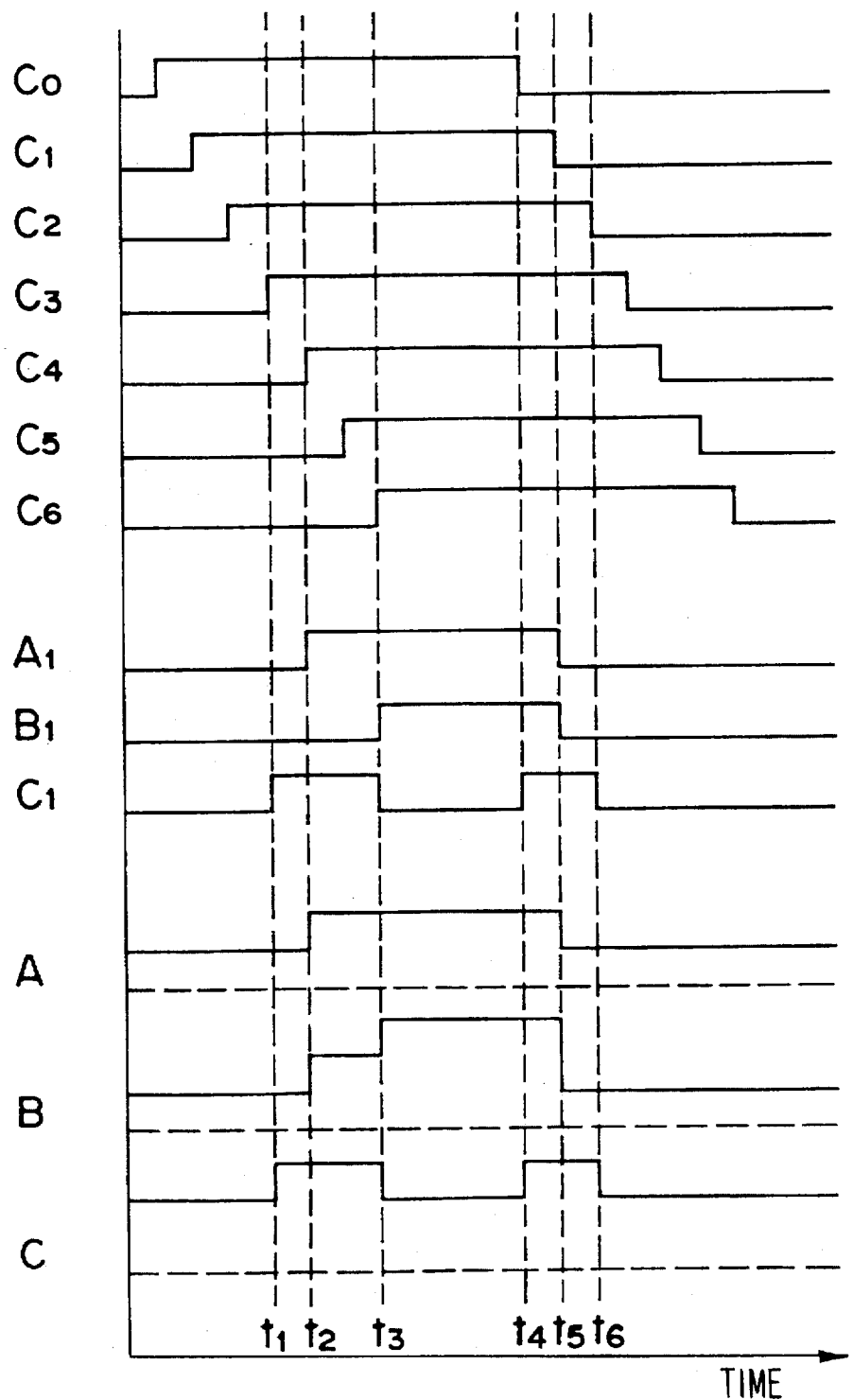
FIG. 10 is an operation diagram of the circuits shown in FIGS. 7, 8 and 9.

FIG. 10 shows the operation of the charge pump circuit. Although the charge pump circuit is constituted by vertically symmetrical circuit portions, the explanation will be given only of the upper half portion for simplicity. To simplify the explanation, no parasitic capacitance is considered and the capacitor coupling ratio is assumed to be infinitive. The signals $C_0$ through $C_6$ are provided with waveforms as shown in FIG. 10 by the driver circuit 57. At the initial state where one cycle operation has finished, a node A and a node B are provided with the potential of VDD and a node C is provided with the potential of 2 VDD. At a time point $t_1$, the signal $C_1$ is changed from Vss to VDD, then the potential of the node C is boosted from 2 VDD to 3 VDD by the capacitive connection of the capacitor Q41. At a time point $t_2$, the signal $A_1$ is changed from Vss to VDD, then the potential of the node A is boosted from VDD to 2 VDD by the capacitive connection of the capacitor Q31. 3 VDD is supplied on the gate of the MOS transistor Q39 and accordingly, the potential of 2 VDD is transmitted to the node B. Successively at a time point $t_3$, the signal $B_1$ is changed from Vss to VDD, then the potential of the node B is boosted from 2 VDD to 3 VDD by the capacitive connection of the capacitor Q33. At this instance, the MOS transistor Q39 is cut off. As a result, the MOS transistor Q35 on the gate of which 3 VDD is applied becomes conductive and 2 VDD at the node A is transmitted to the Vpp node that is an output node. At a time point $t_4$, $C_1$ again rises, at a time point $t_5$, the potentials of $A_1$ and $B_1$ change from VDD to Vss and at a time point $t_6$, $C_1$ falls. The potential $C_1$ is made VDD and the potential of the node C is made 3 VDD before and after the time point $t_5$ for finishing the boosting and transmitting operation to firmly initialize the potential of the node B to VDD.

As explained above theoretically, 2 VDD is stationarily outputted. However, actually Vpp is approximately 4.3V for 3V of VDD by a feedback control and by the parasitic capacitance. The charge pump is very efficient compared with a conventional one. However, high-frequency noises are apt to generate therein and accordingly, it is necessary to connect the de-coupling capacitor DC having a large capacitance to output terminals. Therefore, the characteristic of the charge pump shown in FIG. 9 can be maximized by positively utilizing the parasitic capacitance by using the control system shown in FIG. 2.

Although detailed explanation has been given to the embodiments wherein the present invention is used in a 64M bit DRAM, the present invention is not restricted to the above-mentioned structures and various modifications can naturally be performed so far as these modifications do not deviate from the gist of the invention. Especially, with regard to the structure of the power source circuit, although the stepped-down potential VDD is further boosted in the above-mentioned embodiments, Vcc that is a power source potential inputted from the outside may directly be boosted whereby an effect of simplifying the power source circuit is achieved.

According to the present invention the capacitance of the de-coupling capacitor can be reduced thereby contributing to the reduction in chip area. The capacitance of a de-coupling capacitor can further be reduced in case where a number of memory cell arrays are arranged and only a portion of the arrays are activated.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A semiconductor memory device comprising:
    a booster circuit for generating a boosted potential;

a first memory cell array including first pairs of bit lines;

a second memory cell array including second pairs of bit lines;

a sense amplifier circuit;

a first transmission gate circuit having pairs of transistors for connecting the first pairs of bit lines to the sense amplifier circuit;

a second transmission gate circuit having pairs of transistors for connecting the second pairs of bit lines to the sense amplifier circuit;

a first equalizing circuit having transistors for equalizing the first pairs of bit lines;

a second equalizing circuit having transistors for equalizing the second pairs of bit lines; and a control circuit applying the boosted voltage respectively to gates of the transistors in the first and the second transmission gate circuits and gates of the transistors in the first and the second equalizing circuits when none of memory cells in the first and the second memory cell arrays is selected.

2. The semiconductor memory device according to claim 1, wherein the control circuit applies a ground potential respectively to the gates of the transistors in the first equalizing circuit and the gates of the transistors in the second transmission gate circuit and applies the boosted potential respectively to the gates of the transistors in the second equalizing circuit and the gates of the transistors in the first transmission gate circuit when selecting the memory cells in the first memory cell array; and wherein the control circuit applies the ground potential respectively to the gates of the transistors in the second equalizing circuit and the gates of the transistors in the first transmission gate circuit and applies the boosted potential respectively to the gates of the transistors in the first equalizing circuit and the gates of the transistors in the second transmission gate circuit when selecting the memory cells in the second memory cell array.

3. The semiconductor memory device according to claim 2, wherein first and second word line driving circuits are connected to the first and the second memory cell arrays and the first and the second word line driving circuits are operated by the boosted potential.

4. The semiconductor memory device according to claim 3, wherein the first and the second word line driving circuits are controlled respectively based on selection signals of first and second row decode circuits and the first and the second row decode circuits are operated by the boosted potential.

5. The semiconductor memory device according to claim 1, wherein the control circuit comprises at least first level shift circuit for shifting an amplitude level of a first select signal for selecting the first memory cell array to a level of the boosted potential and second level shift circuit for shifting an amplitude level of a second select signal for selecting the second memory cell array to the level of the boosted potential and the boosted potential is used for a power source of the first and the second level shift circuits.

6. The semiconductor memory device according to claim 5, wherein the control circuit further comprising first and second drive circuits respectively connected to the first and the second level shift circuits, said first and second drive circuits using the boosted potential as a power source and driving the gates of transistors in the first and the second transmission gate circuits and the gates of transistors in the first and the second equalizing circuits to the boosted potential when none of the memory cells in the first and the second memory cell arrays is selected.

7. The semiconductor memory device according to claim 1, wherein capacitive elements are connected to the output of the booster circuit.

8. The semiconductor memory device according to claim 1, wherein the booster circuit generates the boosted potential by stepping down a potential externally inputted and again boosting the potential.

9. A semiconductor memory device comprising:

a booster circuit for generating a boosted potential from an internally-generated reference potential and an externally-received reference potential, the boosted potential being a substantially constant potential;

a first memory cell array including first pairs of bit lines;

a second memory cell array including second pairs of bit lines;

a sense amplifier circuit;

a first transmission gate circuit having pairs of transistors for connecting the first pairs of bit lines to the sense amplifier circuit;

a second transmission gate circuit having pairs of transistors for connecting the second pairs of bit lines to the sense amplifier circuit; and a control circuit applying the boosted potential respectively to gates of the transistors in the first and the second transmission gate circuits when none of memory cells in the first and the second memory cell arrays is selected.

10. The semiconductor memory device according to claim 9, wherein the control circuit applies a ground potential to the gates of the transistors in the second transmission gate circuits and applies the boosted potential to the gates of the transistors in the first transmission gate circuit when selecting the memory cells in the first memory cell array; and the control circuit applies the ground potential to the gates of the transistors in the first transmission gate circuit and applies the boosted potential to the gates of the transistors in the second transmission gate circuit when selecting the memory cells in the second memory cell array.

11. A semiconductor memory device comprising:

a booster circuit for generating a boosted potential;

a first memory cell array including first pairs of bit lines;

a second memory cell array including second pairs of bit lines;

a sense amplifier circuit;

a first transmission gate circuit having pairs of transistors for connecting the first pairs of bit lines to the sense amplifier circuit;

a second transmission gate circuit having pairs of transistors for connecting the second pairs of bit lines to the sense amplifier circuit; and a control circuit applying the boosted potential respectively to gates of the transistors in the first and the second transmission gate circuits when none of memory cells in the first and the second memory cell arrays is selected, wherein the control circuit applies a ground potential to the gates of the transistors in the second transmission gate circuits and applies the boosted potential to the gates of the transistors in the first transmission gate circuit when selecting the memory cells in the first memory cell array, wherein the control circuit applies the ground potential to the gates of the transistors in the first transmission gate circuit and applies the boosted potential to the gates of the transistors in the second transmission gate circuit when selecting the memory cells in the second memory cell array, and wherein first and second word line driving circuits are respectively connected to the first and the second memory cell arrays and the first and the second word line driving circuits are operated by the boosted potential.

12. The semiconductor memory device according to claim 11, wherein the first and the second word line driving circuits are controlled respectively based on selection signals of first and second row decode circuits and the first and the second row decode circuits are operated by the boosted potential.

13. The semiconductor memory device according to claim 12, wherein the control circuit comprises at least a first level shift circuit for shifting an amplitude level of a first select signal for selecting the first memory cell array to a level of the boosted potential and a second level shift circuit for shifting an amplitude level of a second select signal for selecting the second memory cell array to the level of the boosted potential and the boosted potential is used for a power source of the first and the second level shift circuits.

14. The semiconductor memory device according to claim 13, wherein the control circuit further comprises first and second drive circuits respectively connected to the first and the second level shift circuits, said first and second drive circuits using the boosted potential as a power source and driving the gates of the transistors in the first and the second transmission gate circuits to the boosted potential when none of the memory cells in the first and the second memory cell arrays is selected.

15. A semiconductor memory device comprising:

a booster circuit for generating a boosted potential;
a first memory cell array including first pairs of bit lines;
a second memory cell array including second pairs of bit lines;
a sense amplifier circuit;
a first transmission gate circuit having pairs of transistors for connecting the first pairs of bit lines to the sense amplifier circuit;
a second transmission gate circuit having pairs of transistors for connecting the second pairs of bit lines to the sense amplifier circuit; and
a control circuit applying the boosted potential respectively to gates of the transistors in the first and the second transmission gate circuits when none of memory cells in the first and the second memory cell arrays is selected, wherein capacitive elements are connected to the output of the booster circuit.

16. A semiconductor memory device comprising:

a booster circuit for generating a boosted potential;
a first memory cell array including first pairs of bit lines;
a second memory cell array including second pairs of bit lines;
a sense amplifier circuit;
a first transmission gate circuit having pairs of transistors for connecting the first pairs of bit lines to the sense amplifier circuit;
a second transmission gate circuit having pairs of transistors for connecting the second pairs of bit lines to the sense amplifier circuit; and
a control circuit applying the boosted potential respectively to gates of the transistors in the first and the second transmission gate circuits when none of memory cells in the first and the second memory cell arrays is selected, wherein the booster circuit generates the boosted potential by stepping down a potential externally inputted and again boosting the potential.

17. A semiconductor memory device, comprising:

a first bit line connected to a first memory cell;
a second bit line connected to a second memory cell;
a sense amplifier circuit shared by the first and the second bit lines, for sensing data read out from the first or the second memory cells;
a first MOS transistor inserted between the first bit line and the sense amplifier circuit;
a second MOS transistor inserted between the second bit line and the sense amplifier circuit; and
a control circuit for:
(a) supplying a first potential to gate electrodes of both of the first and the second MOS transistors when the first and the second memory cells are not selected, the first potential being supplied by a booster circuit which outputs the first potential at a substantially constant level,
(b) supplying the first potential to the gate electrode of the first MOS transistor and supplying a second potential to the gate electrode of the second MOS transistor when the first memory cell is selected, and
(c) supplying the second potential to the gate electrode of the first MOS transistor and supplying the first potential to the gate electrode of the second MOS transistor when the second memory cell is selected.

18. The semiconductor memory device according to claim 17 wherein the first potential is higher than the second potential.

19. The semiconductor memory device according to claim 18 wherein the first potential is a boosted up potential.

20. A semiconductor memory device, comprising:

a first bit line connected to a first memory cell;
a second bit line connected to a second memory cell; a sense amplifier circuit shared by the first and the second bit lines, for sensing data read out from the first or the second memory cells;
a first MOS transistor connected between the first bit line and a reference voltage supply source;
a second MOS transistor connected between the second bit line and the reference voltage supply source; and
a control circuit for:
(a) supplying a first potential to gate electrodes of both of the first and the second MOS transistors when the first and the second memory cells are not selected,
(b) supplying a second potential to the gate electrode of the first MOS transistor and supplying the first potential to the gate electrode of the second MOS transistor when the first memory cell is selected, and
(c) supplying the first potential to the gate electrode of the first MOS transistor and supplying the second potential to the gate electrode of the second MOS transistor when the second memory cell is selected.

21. The semiconductor memory device according to claim 20 wherein the first potential is higher than the second potential, and the level of a reference voltage is between the first potential and the second voltage.

22. The semiconductor memory device according to claim 21 wherein the first potential is a boosted up potential.

23. A semiconductor memory device, comprising:

a first bit line connected to a first memory cell;

a second bit line connected to a second memory cell;

a sense amplifier circuit shared by the first and the second bit lines, for sensing data read out from the first or the second memory cells;

a first MOS transistor inserted between the first bit line and the sense amplifier circuit;

a second MOS transistor inserted between the second bit line and the sense amplifier circuit;

a third MOS transistor connected between the first bit line and a reference voltage supply source;

a fourth MOS transistor connected between the second bit line and the reference voltage supply source; and a control circuit for:
  (a) supplying a first potential to gate electrodes of the first, second, third and fourth MOS transistors when the first and the second memory cells are not selected,
  (b) supplying the first potential to the gate electrodes of the first and fourth MOS transistors and supplying a second potential to the gate electrodes of the second and third MOS transistors when the first memory cell is selected, and
  (c) supplying the second potential to the gate electrodes of the first and fourth MOS transistors and supplying the first potential to the gate electrodes of the second and third MOS transistors when the second memory cell is selected.

24. The semiconductor memory device according to claim 23 wherein the first potential is higher than the second potential.

25. The semiconductor memory device according to claim 24 wherein the first potential is a boosted up potential.

26. A semiconductor memory device, comprising:

a first bit line connected to a first memory cell;

a second bit line connected to a second memory cell;

a sense amplifier circuit shared by the first and the second bit lines, for sensing data read out from the first or the second memory cells;

a first MOS transistor inserted between the first bit line and the sense amplifier circuit;

a second MOS transistor inserted between the second bit line and the sense amplifier circuit; and a control circuit for:
  (a) turning both of the first and the second MOS transistors ON when the first and the second memory cells are not selected,
  (b) maintaining the first MOS transistor ON and turning the second MOS transistor OFF when the first memory cell is selected, and
  (c) turning the first MOS OFF and maintaining the second MOS transistor ON when the second memory cell is selected, wherein the first and the second MOS transistors are turned ON by receiving a substantially constant boosted voltage from the control circuit.

27. The semiconductor memory device according to claim 26 wherein a boosted up potential is supplied to a gate of the first and the second MOS transistors when said first and the second MOS transistors are ON.

28. A semiconductor memory device, comprising:

a first bit line connected to a first memory cell;

a second bit line connected to a second memory cell;

a sense amplifier circuit shared by the first and the second bit lines, for sensing data read out from the first or the second memory cells;

a first MOS transistor connected between the first bit line and a reference voltage supply source;

a second MOS transistor connected between the second bit line and the reference voltage supply source; and a control circuit for:
  (a) turning both of the first and the second MOS transistors ON when the first and the second memory cells are not selected,
  (b) turning the first MOS transistor OFF and maintaining the second MOS transistor ON when the first memory cell is selected, and
  (c) maintaining the first MOS transistor ON and turning the second MOS transistor OFF when the second memory cell is selected.

29. The semiconductor memory device according to claim 28 wherein a boosted up potential is supplied to a gate of the first and the second MOS transistors when the first and the second MOS transistors are ON.

30. A semiconductor memory device, comprising:

a first bit line connected to a first memory cell;

a second bit line connected to a second memory cell;

a sense amplifier circuit shared by the first and the second bit lines, for sensing data read out from the first or the second memory cells;

a first MOS transistor inserted between the first bit line and the sense amplifier circuit;

a second MOS transistor inserted between the second bit line and the sense amplifier circuit;

a third MOS transistor connected between the first bit line and a reference voltage supply source;

a fourth MOS transistor connected between the second bit line and the reference voltage supply source; and a control circuit for:
  (a) turning the first, second, third and fourth MOS transistors ON when the first and the second memory cells are not selected,
  (b) maintaining the first and fourth MOS transistors ON and turning the second and third MOS transistors OFF when the first memory cell is selected, and
  (c) turning the first and fourth MOS transistors OFF and maintaining the second and third MOS transistors ON when the second memory cell is selected.

31. The semiconductor memory device according to claim 30 wherein a boosted up potential is supplied to a gate of the first, second, third and fourth MOS transistors when the first, second, third and fourth MOS transistors are ON.

32. A method for increasing a de-coupling capacitance in a semiconductor memory device, the semiconductor memory device comprising:

a first bit line connected to a first memory cell;

a second bit line connected to a second memory cell; a sense amplifier circuit shared by the first and the second bit lines, for sensing data read out from the first or the second memory cells;

a first MOS transistor inserted between the first bit line and the sense amplifier circuit; and a second MOS transistor inserted between the second bit line and the sense amplifier circuit;

the method comprising the steps of:
  turning both of the first and the second MOS transistors ON when the first and the second memory cells are not selected;

maintaining the first MOS transistor ON and turning the second MOS transistor OFF when the first memory cell is selected;

turning the first MOS transistor OFF and maintaining the second MOS transistor ON when the second memory cell is selected, wherein the first and the second MOS transistors are turned ON by receiving a substantially constant boosted voltage.

33. A method for increasing a de-coupling capacitance in a semiconductor memory device, the semiconductor memory device comprising:

a first bit line connected to a first memory cell;

a second bit line connected to a second memory cell; a sense amplifier circuit shared by the first and the second bit lines, for sensing data read out from the first or the second memory cells;

a first MOS transistor connected between the first bit line and a reference voltage supply source;

a second MOS transistor connected between the second bit line and the reference voltage supply source; and a control circuit connected to said first and second MOS transistors, the method comprising the steps of:

turning both of the first and the second MOS transistors ON when the first and the second memory cells are not selected;

turning the first MOS transistor OFF and maintaining the second MOS transistor ON when the first memory cell is selected; and maintaining the first MOS transistor ON and turning the second MOS transistor OFF when the second memory cell is selected.

34. A method for increasing a de-coupling capacitance in a semiconductor memory device, the semiconductor memory device comprising:

a first bit line connected to a first memory cell;

a second bit line connected to a second memory cell; a sense amplifier circuit shared by the first and the second bit lines, for sensing data read out from the first or the second memory cells;

a first MOS transistor inserted between the first bit line and the sense amplifier circuit;

a second MOS transistor inserted between the second bit line and the sense amplifier circuit;

a third MOS transistor connected between the first bit line and a reference voltage supply source; and a fourth MOS transistor connected between the second bit line and the reference voltage supply source;

the method comprising the steps of:

turning the first, second, third and fourth MOS transistors ON when the first and the second memory cells are not selected;

maintaining the first and fourth MOS transistors ON and turning the second and third MOS transistors OFF when the first memory cell is selected; and turning the first and fourth MOS transistors OFF and maintaining the second and third MOS transistors ON when the second memory cell is selected.

35. The semiconductor memory device according to claim 1, wherein the booster circuit comprises a power supply for outputting the boosted potential at a substantially constant level.

36. The semiconductor memory device according to claim 20, further comprising a power supply, wherein the power supply outputs the first potential at a substantially constant level.

37. The semiconductor memory device according to claim 23, further comprising a power supply, wherein the power supply outputs the first potential at a substantially constant level.

38. The semiconductor memory device according to claim 28, further comprising a power supply, wherein the control circuit controls the power supply to output a first potential at a substantially constant level to the first and second MOS transistors so as to turn the first and second MOS transistors ON, and wherein the control circuit controls the power supply to output a second potential at a substantially constant level lower than the first potential to the first and second MOS transistors so as to turn the first and second MOS transistors OFF.

39. The semiconductor memory device according to claim 30, further comprising a power supply, wherein the control circuit controls the power supply to output a first potential at a substantially constant level to the first, second, third and fourth MOS transistors so as to turn the first through fourth MOS transistors ON, and wherein the control circuit controls the power supply to output a second potential at a substantially constant level lower than the first potential to the first through fourth MOS transistors so as to turn the first through fourth MOS transistors OFF.

40. The method according to claim 33, wherein a first potential is supplied at a substantially constant level to the first and second MOS transistors so as to turn the first and second MOS transistors ON, and wherein a second potential is applied at a substantially constant level lower than the first potential to the first and second MOS transistors so as to turn the first and second MOS transistors OFF.

41. The method according to claim 34, wherein a first potential is supplied at a substantially constant level to the first, second, third and fourth MOS transistors so as to turn the first through fourth MOS transistors ON, and wherein a second potential is applied at a substantially constant level lower than the first potential to the first through fourth MOS transistors so as to turn the first through fourth MOS transistors OFF.

42. The semiconductor memory device according to claim 1, wherein capacitive elements are connected to the output of the booster circuit, and wherein the pairs of transistors of the first and second transmission gate circuits provide a parasitic capacitance connected in parallel to the capacitive elements so as to provide an overall greater capacitance for the semiconductor memory device.

43. The semiconductor memory device according to claim 9, wherein capacitive elements are connected to the output of the booster circuit, and wherein the pairs of transistors of the first and second transmission gate circuits provide a parasitic capacitance connected in parallel to the capacitive elements so as to provide an overall greater capacitance for the semiconductor memory device.

44. The semiconductor memory device according to claim 17, wherein capacitive elements are connected to the output of the booster circuit, and wherein the first and second MOS transistors provide a parasitic capacitance connected in parallel to the capacitive elements so as to provide an overall greater capacitance for the semiconductor memory device.

45. The semiconductor memory device according to claim 20, wherein the control circuit includes a booster circuit for outputting the first and second potential, the booster circuit having capacitive elements connected to an output port of the booster circuit, and wherein the first and second MOS transistors provide a parasitic capacitance connected in parallel to the capacitive elements so as to provide an overall greater capacitance for the semiconductor memory device.

46. The semiconductor memory device according to claim 23, wherein the control circuit includes a booster circuit for outputting the first and second potential, the booster circuit having capacitive elements connected to an output port of the booster circuit, and wherein the first, second, third and fourth MOS transistors provide a parasitic capacitance connected in parallel to the capacitive elements so as to provide an overall greater capacitance for the semiconductor memory device.

47. The semiconductor memory device according to claim 17, wherein the control circuit includes a booster circuit for outputting the first and second potential, the booster circuit having capacitive elements connected to an output port of the booster circuit, and wherein the first and second MOS transistors provide a parasitic capacitance connected in parallel to the capacitive elements so as to provide an overall greater capacitance for the semiconductor memory device.

48. The semiconductor memory device according to claim 20, wherein the control circuit includes a booster circuit for outputting the first and second potential, the booster circuit having capacitive elements connected to an output port of the booster circuit, and wherein the first and second MOS transistors provide a parasitic capacitance connected in parallel to the capacitive elements so as to provide an overall greater capacitance for the semiconductor memory device.

49. The semiconductor memory device according to claim 23, wherein the control circuit includes a booster circuit for outputting the first and second potential, the booster circuit having capacitive elements connected to an output port of the booster circuit, and wherein the first, second, third and fourth MOS transistors provide a parasitic capacitance connected in parallel to the capacitive elements so as to provide an overall greater capacitance for the semiconductor memory device.

* * * * *